US012581918B2

(12) United States Patent
Kim et al.

(10) Patent No.: US 12,581,918 B2
(45) Date of Patent: Mar. 17, 2026

(54) FABRICATING METHOD FOR TEST ELEMENT GROUP

(71) Applicant: SAMSUNG ELECTRONICS CO., LTD., Suwon-si (KR)

(72) Inventors: Sun Woo Kim, Suwon-si (KR); Min Hyung Kang, Suwon-si (KR); Min Seob Kim, Suwon-si (KR); Chan Geun Ahn, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 459 days.

(21) Appl. No.: 18/118,175

(22) Filed: Mar. 7, 2023

(65) Prior Publication Data

US 2024/0055303 A1 Feb. 15, 2024

(30) Foreign Application Priority Data

Aug. 12, 2022 (KR) ........................ 10-2022-0101073

(51) Int. Cl.
*H01L 21/66* (2006.01)
*H10D 84/01* (2025.01)
*H10D 84/03* (2025.01)

(52) U.S. Cl.
CPC ........... *H01L 22/14* (2013.01); *H10D 84/013* (2025.01); *H10D 84/0158* (2025.01); *H10D 84/038* (2025.01)

(58) Field of Classification Search
CPC ......... H01L 22/30; H01L 22/00; H01L 22/34; H01L 22/14; H01L 21/02532; H01L 21/0262; H10D 30/6211; H10D 84/013;

H10D 84/0158; H10D 84/038; H10D 62/151; H10D 84/853; H10D 84/0193; H10D 30/62; H10D 84/017
See application file for complete search history.

(56) References Cited

U.S. PATENT DOCUMENTS

| | | | |
|---|---|---|---|
| 9,972,550 B2 | 5/2018 | Nowak et al. | |
| 10,048,311 B2 | 8/2018 | Moll et al. | |
| 10,622,265 B2 | 4/2020 | Choi et al. | |
| 10,957,605 B2 | 3/2021 | Zhang et al. | |
| 11,211,297 B2 | 12/2021 | Lin et al. | |
| 2017/0243868 A1* | 8/2017 | Lee ...................... H10D 62/115 |
| 2019/0067451 A1* | 2/2019 | Ching .................. H10D 84/038 |
| 2019/0326187 A1* | 10/2019 | Sagong .................. H10B 10/12 |

(Continued)

FOREIGN PATENT DOCUMENTS

| | | |
|---|---|---|
| KR | 10-2003-0022612 A | 3/2003 |
| KR | 10-2023-0001806 A | 1/2023 |

*Primary Examiner* — Julio J Maldonado
*Assistant Examiner* — Nathan Pridemore
(74) *Attorney, Agent, or Firm* — Muir Patent Law, PLLC

(57) ABSTRACT

A fabricating method for a test element group is provided. The fabricating method for a test element group includes fabricating test areas generated in a scribe lane area, wherein fabricating of the test areas includes forming a plurality of fins protruding in a first direction on a substrate, covering at least some of the plurality of fins with a masking material, and performing selective epitaxial growth by injecting a gas onto the plurality of fins. The gas is not injected onto the at least some of the plurality of fins that are covered with the masking material, such that the epitaxial growth does not occur on the fins covered with the masking material.

20 Claims, 16 Drawing Sheets

(56)        References Cited

U.S. PATENT DOCUMENTS

| 2020/0161198 | A1* | 5/2020 | Park ................... H10D 84/834 |
| 2021/0231727 | A1 | 7/2021 | Park et al. |
| 2022/0413038 | A1 | 12/2022 | Kim et al. |

* cited by examiner

TA

TA

TA

T_R

M_R

FABRICATING METHOD FOR TEST ELEMENT GROUP

CROSS-REFERENCE TO RELATED APPLICATION

This application claims priority from Korean Patent Application No. 10-2022-0101073 filed on Aug. 12, 2022 in the Korean Intellectual Property Office, and all the benefits accruing therefrom under 35 U.S.C. 119, the contents of which in its entirety are herein incorporated by reference.

BACKGROUND

1. Field

The present disclosure relates to a fabricating method for a test element group.

2. Description of the Related Art

In order to fabricate a semiconductor device, integrated circuits are formed on a semiconductor wafer. In order to determine the defect or reliability of the integrated circuit, it has been desirable to measure electrical characteristics of the integrated circuit. Accordingly, a test element group (TEG) having the same structure as the integrated circuit may be formed in a scribe lane area of a semiconductor wafer.

SUMMARY

Embodiments are directed to a fabricating method for a test element group. The fabricating method includes fabricating test areas generated in a scribe lane area, Fabricating of the test areas includes forming a plurality of fins protruding in a first direction on a substrate, covering at least some of the plurality of fins with a masking material, and performing selective epitaxial growth by injecting a gas onto the plurality of fins. When the gas is not injected onto at least some of the plurality of fins covered with the masking material, the epitaxial growth does not occur on the fins covered with the masking material.

The fabrication method may further include forming a source/drain through the epitaxial growth only on the fins that are not covered with the masking material of the plurality of fins.

The gas includes a silicon source gas, a germanium source gas, an etching gas, and a carrier gas. The fabricating of the test areas may further include removing the masking material after the gas is injected.

Aspects of the present disclosure provide a fabricating method for a test device group with improved test reliability of an integrated circuit.

According to an aspect of the present inventive concept, there is provided a fabricating method for a test element group, the fabricating method comprising, fabricating test areas generated in a scribe lane area, wherein the fabricating of the test areas includes forming a plurality of fins protruding in a first direction on a substrate, covering at least some of the plurality of fins with a masking material, and performing selective epitaxial growth by injecting a gas onto the plurality of fins, such that the gas is not injected onto at least some of the plurality of fins covered with the masking material, and such that the epitaxial growth does not occur on the fins covered with the masking material.

A fabricating method for a test element group may include generating a plurality of chip areas on a substrate, generating a scribe lane area that divides the plurality of chip areas, and generating test areas in the scribe lane area, wherein the fabricating of the test areas includes, forming a plurality of fins protruding in a first direction on the substrate, covering at least some of the plurality of fins with a masking material, and performing selective epitaxial growth by injecting a gas onto the plurality of fins, and the gas is not injected onto at least some of the plurality of fins covered with the masking material, so that the epitaxial growth does not occur on the fins covered by the masking material.

According to an embodiment a fabricating method for a test element group may include generating a plurality of chip areas on a substrate, generating a scribe lane area that divides the plurality of chip areas, and generating test areas in the scribe lane area, wherein the fabricating of the test areas includes dividing the test areas in which integrated circuits included in the plurality of chip areas are fabricated into a test group area and a masking area, and generating a source/drain through epitaxial growth only within the test group area.

Aspects of the present disclosure are not restricted to those set forth herein. The above aspects and other aspects of the present disclosure will become more apparent to one of ordinary skill in the art to which the present disclosure pertains by referencing the detailed description of the present disclosure given below.

The details of other exemplary embodiments are included in the detailed description and drawings.

BRIEF DESCRIPTION OF THE DRAWINGS

Features will become apparent to those of skill in the art by describing in detail exemplary embodiments with reference to the attached drawings in which.

DETAILED DESCRIPTION

A semiconductor device 1 according to an exemplary embodiment may include test areas TA.

The test areas TA according to some exemplary embodiments may be formed in a scribe lane area SL.

The test areas TA may be areas in which test structures for testing physical or electrical characteristics of various elements constituting the semiconductor device 1 may be formed.

For example, the semiconductor device 1 according to an exemplary embodiment may include elements such as active areas, gate electrodes, source/drain areas, and wirings The test areas TA may be areas in which test structures for testing the above-described elements may be formed.

For example, in the test areas TA, a plurality of integrated circuits formed on a wafer or a substrate included in a plurality of chip areas CA may be generated. By testing physical or electrical characteristics of the integrated circuits included in the test areas TA, the reliability of the integrated circuits included in the plurality of chip areas CA may be determined.

The semiconductor device 1 according to an exemplary embodiment may be provided as a semi-finished product in a semiconductor wafer state. In some implementations, the semiconductor device 1 according to an exemplary embodiment may be provided in a form of a semiconductor package or a semiconductor chip processed in a package form by performing a package process in a semi-finished product in a semiconductor wafer state.

In this case, when a test element group including the test areas TA is fabricated, the test areas TA may be divided into a test group area and a masking area, such that only the test group area may be tested for physical or electrical charac-teristics.

In more detail, a source/drain may be formed only in the test group area within the test areas TA of the test element group, such that electrical characteristics thereof may be tested.

In order to form the source/drain in the semiconductor device 1, a wafer may be inserted into a chamber. When an amount of gas injected into the chamber is constant, a certain area within the test areas TA may be limited to allow the gas to be injected only into the limited area (e.g., the test group area). By this method, the amount of gas injected into the limited area (e.g., the test group area) may be increased, such that formation efficiency of the source/drain may be ampli-fied, As a result, test reliability for electrical characteristics for the source/drain may be improved.

Hereinafter, exemplary examples of a fabricating method for a test element group for fabricating the test structures that may be formed in the above-described test areas TA will be described. The test element group according to an exemplary embodiment of the present disclosure described below may be formed in a scribe lane.

Figure 2:
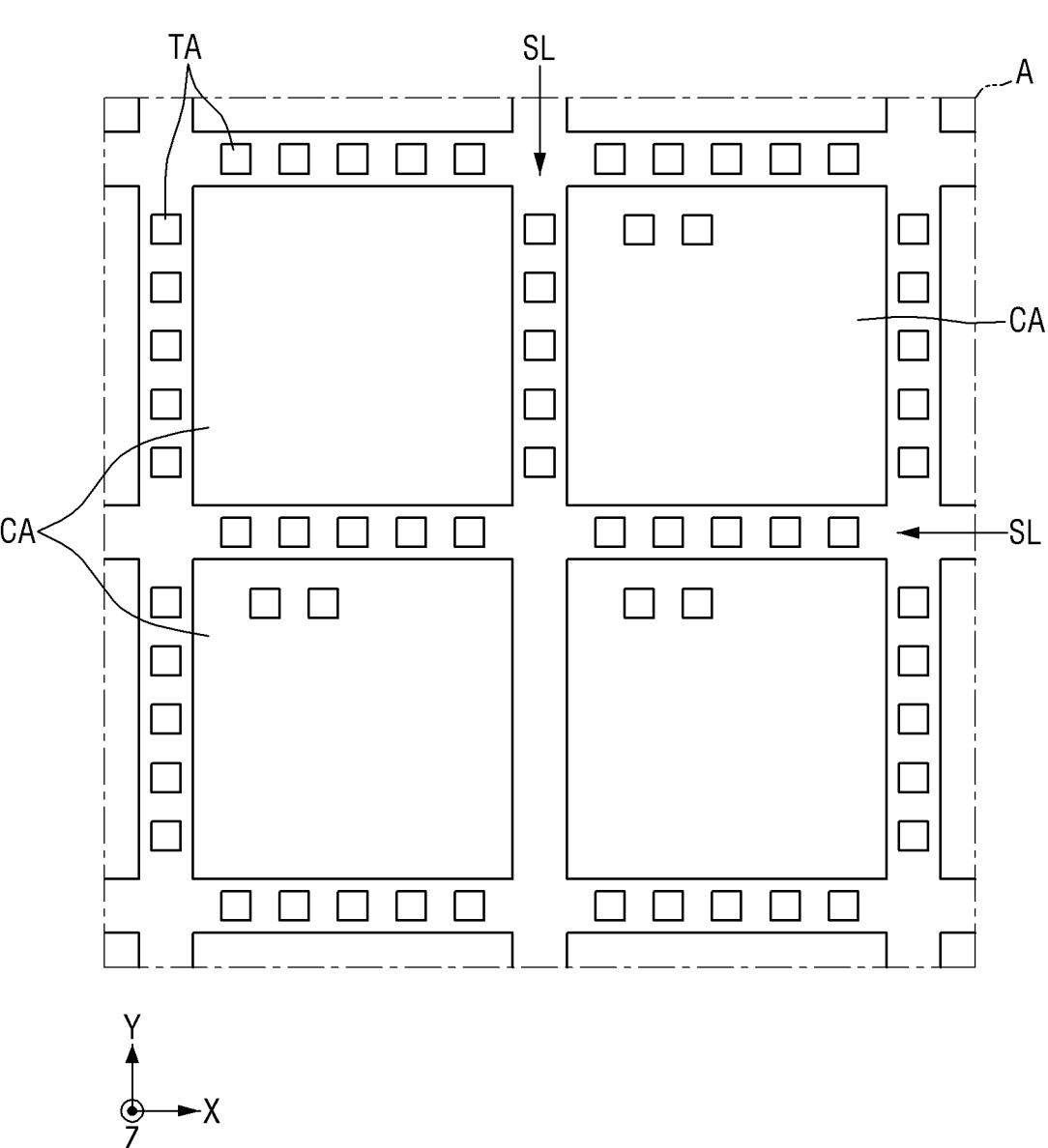
FIG. 2 is an enlarged view of area A of FIG. 1.
Figure 3:
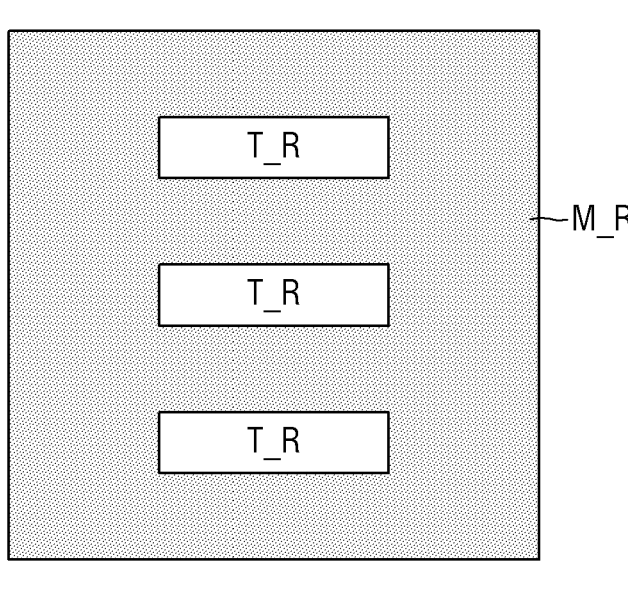
FIGS. 3 to 5 are exemplary enlarged views of a test area TA of FIG. 2.
Figure 3:
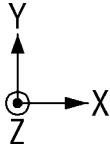
Figure 4:
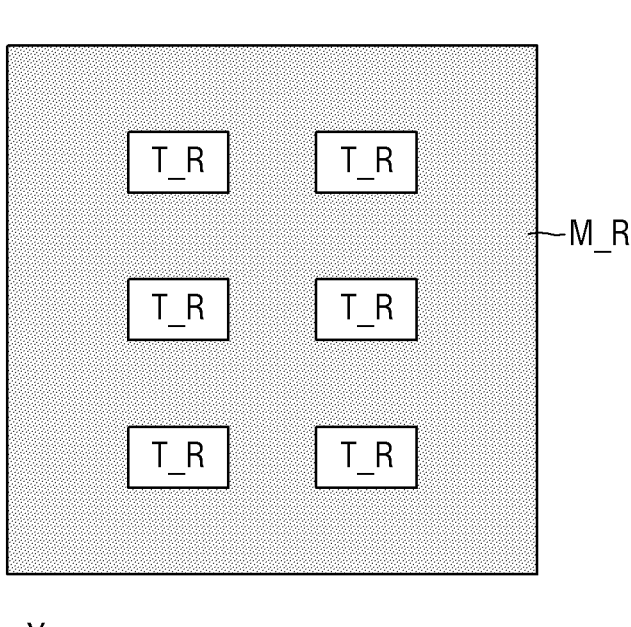
Figure 5:
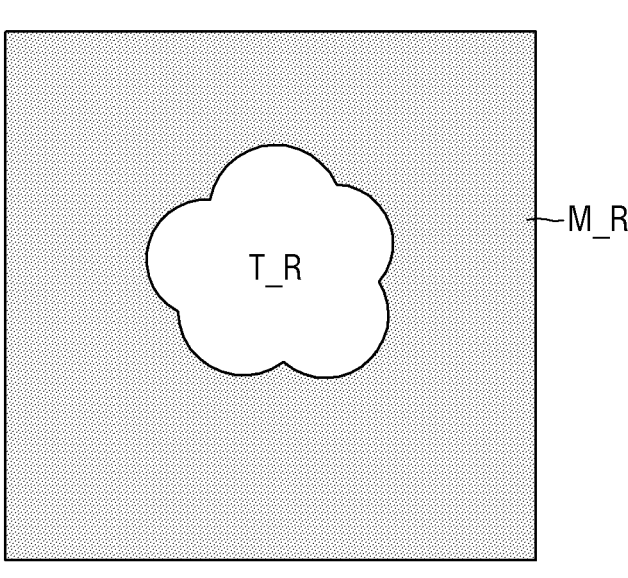
Figure 5:
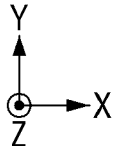

FIGS. 3 to 5 are exemplary enlarged views of a test area TA of FIG. 2.

Referring to FIGS. 1 to 5, the source/drain may be formed only in a test group area T_R within the test areas TA of the test element group, such that the electrical characteristics thereof may be tested.

In order to form the source/drain in the semiconductor device 1, a wafer may be inserted into a chamber. When an amount of gas injected into the chamber is constant, a certain area within the test areas TA may be limited to allow the gas to be injected only into the limited area (e.g., the test group area T_R). Accordingly, the amount of gas injected into the limited area (e.g., the test group area T_R) may be increased, such that formation efficiency of the source/drain may be amplified. As a result, test reliability for electrical charac-teristics of the source/drain may be improved.

For example, the source/drain in the test group area T_R in the test areas TA may be formed by performing a selective epitaxial growth (SEG) process.

In exemplary embodiments, the selective epitaxial growth (SEG) process may be performed by supplying a silicon source gas, a germanium source gas, an etching gas, and a carrier gas to the wafer including the test areas TA.

The masking area M_R may be covered with a masking material through which the gases used in the selective epitaxial growth (SEG) process do not permeate.

Therefore, the source/drain formed through the selective epitaxial growth (SEG) process may not be formed in the masking area M_R. For example, the source/drain may be formed only in the test group area T_R through the selective epitaxial growth (SEG) process.

That is, in the test device group manufacturing method according to some embodiments, in order to form the source/drain in the semiconductor device 1, a wafer is inserted into a chamber. In this case, since an amount of gas injected into the chamber (the gas used for the selective epitaxial growth described above) is constant, a certain area within the test areas TA is limited to allow the gas to be injected only into the limited area (e.g., the test group area T_R). Through this, the amount of gas injected into the limited area (e.g., the test group area T_R) may be increased, such that formation efficiency of the source/drain is ampli-fied, and as a result, test reliability for electrical character-istics for the source/drain may be improved.

Accordingly, a single-crystal silicon-germanium layer may be formed as the source/drain in the test group area T_R. In addition, the selective epitaxial growth (SEG) process may use a p-type impurity source gas together with silicon-germanium, and accordingly, a single crystal silicon-germanium layer doped with a p-type impurity may be formed as sources/drains in the test group area T_R.

In another embodiment, the selective epitaxial growth (SEG) process may be performed using a silicon source gas, a carbon source gas, an etching gas, and a carrier gas. Accordingly, a single crystal silicon carbide layer may be formed to provide sources/drains in the test group area T_R. In addition, the selective epitaxial growth (SEG) process may include an n-type impurity source gas together, and accordingly, a single crystal silicon-carbide layer doped with an n-type impurity may be formed as the sources/drains in the test group area T_R. In some implementations, the selective epitaxial growth (SEG) process may be performed using a silicon source gas, an etching gas, and a carrier gas, and accordingly, a single crystal silicon layer may be formed as the sources/drains in the test group area T_R. In this case, the single crystal silicon layer doped with the n-type impu-rity may be formed by including the n-type impurity source gas together.

A plurality of test group areas T_R may be formed in the test area TA as illustrated in FIGS. 3 and 4. In some implementations, the test group area T_R may be formed in a rectangular shape in the test area TA as illustrated in FIGS. 3 and 4. In some implementations, the test group area T_R may be formed in a curved shape in the test area TA as illustrated in FIG. 5. In this case, a surface area of the test group area T_R into which the gas is injected may be further increased.

In the fabricating method for the test element group according to some exemplary embodiments, the shape and number of the test group areas T_R in the test area TA are not limited to those illustrated in the drawings.

FIGS. 6 to 15 are views illustrating intermediate steps explaining a fabricating method for forming the test element group in the semiconductor device according to some exem-plary embodiments.

Figure 6:
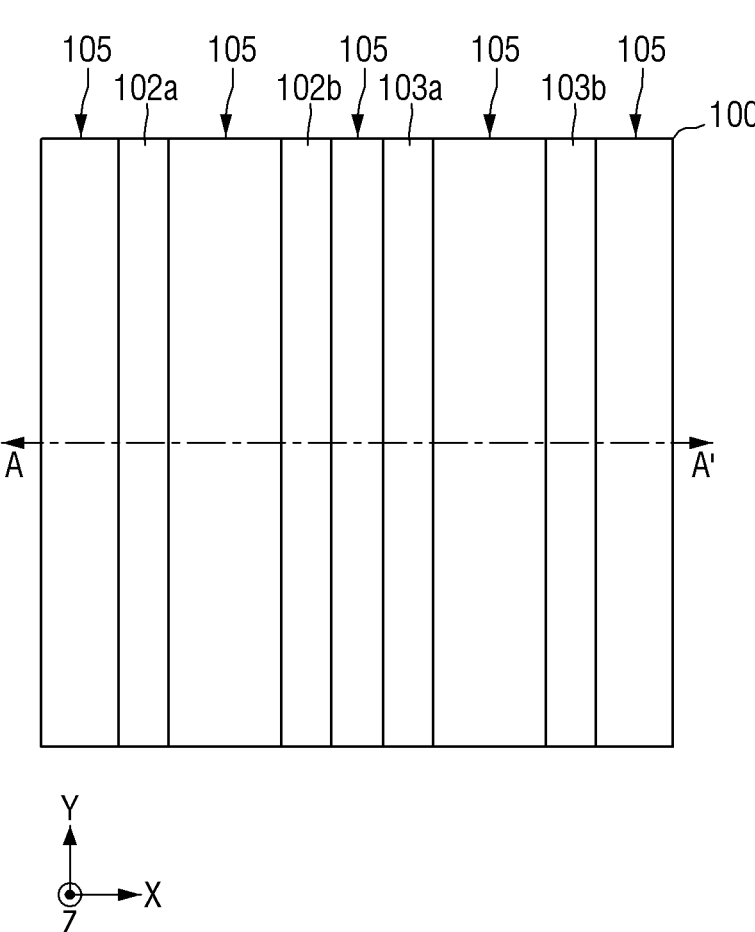
FIGS. 6 to 15 are views illustrating intermediate steps in a fabricating method in order to explain the fabricating method for a test element group in the semiconductor device according to some exemplary embodiments.
Figure 7:
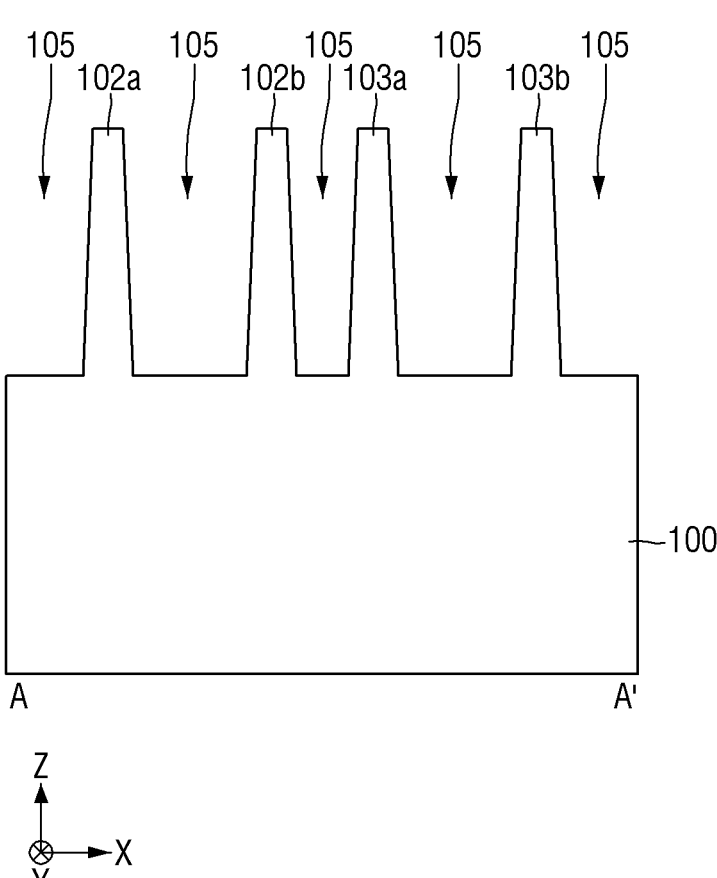

First, referring to FIGS. 6 and 7, a recess 105 may be formed by partially etching an upper portion of a substrate 100.

The substrate 100 may include silicon, germanium, sili-con-germanium, or a group III-V compound such as GaP, GaAs, or GaSb. According to some exemplary embodi-ments, the substrate 100 may be a silicon-on-insulator (SOI) substrate or a germanium-on-insulator (GOI) substrate.

Figure 1:
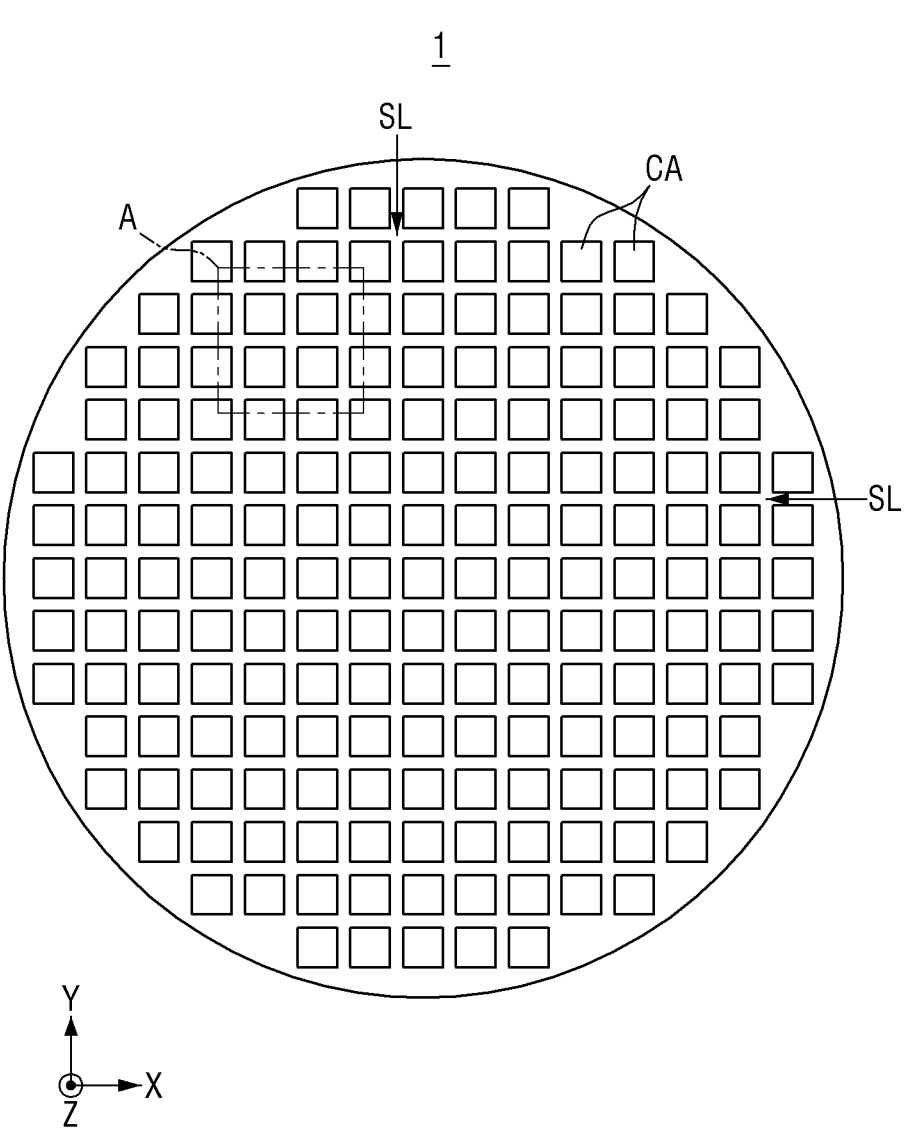
FIG. 1 is a plan view illustrating a semiconductor device according to some exemplary embodiments.

The substrate 100 may be a scribe lane area that surrounds a chip area in which various elements of the semiconductor device 1 of FIG. 1 are formed and then removed by dicing.

Each of the active fins 102a, 102b, 103a, and 103b may extend in a second direction Y parallel to the upper surface of the substrate 100. The plurality of active fins 102*a*, 102*b*, 103*a*, and 103*b* may be formed in a first direction X parallel to the upper surface of the substrate 100 and intersecting the second direction Y.

Figure 8:
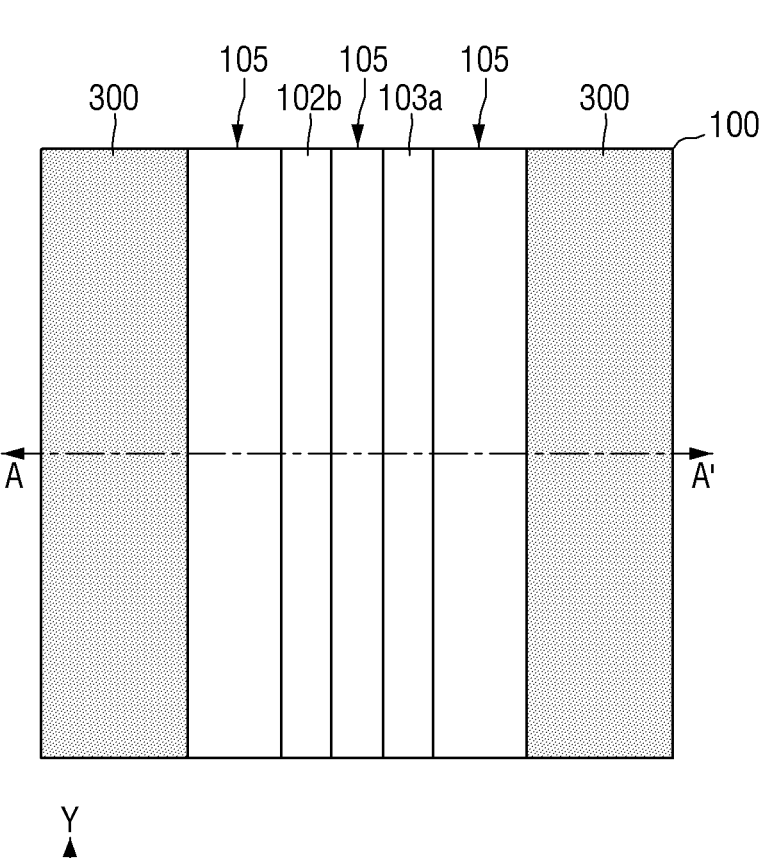
Figure 9:
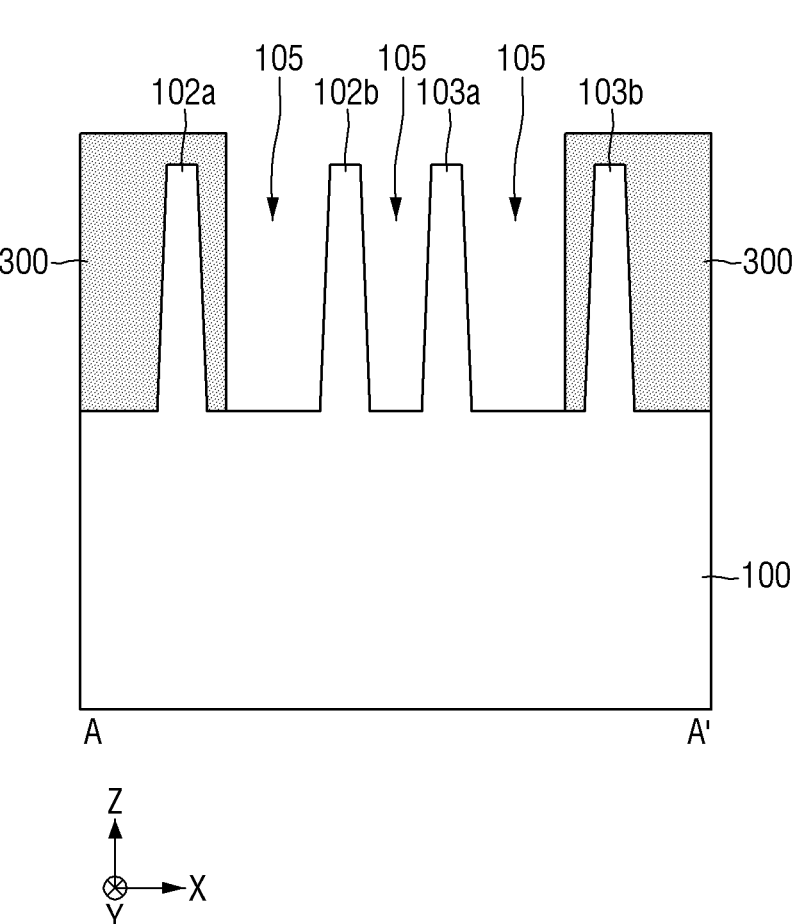

Thereafter, referring to FIGS. 8 and 9, at least some of the plurality of active fins 102*a*, 102*b*, 103*a*, and 103*b* (e.g., the active fins 102*a* and 103*b*) may be covered with a masking material 300.

The masking material 300 may include a material through which gases used in a selective epitaxial growth (SEG) process do not permeate.

Figure 10:
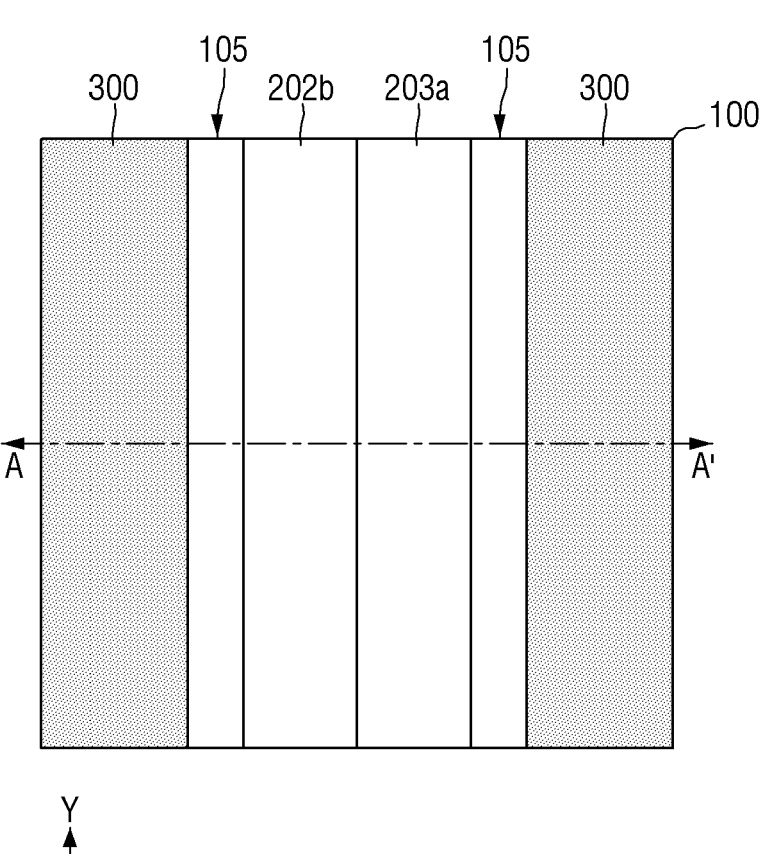
Figure 11:
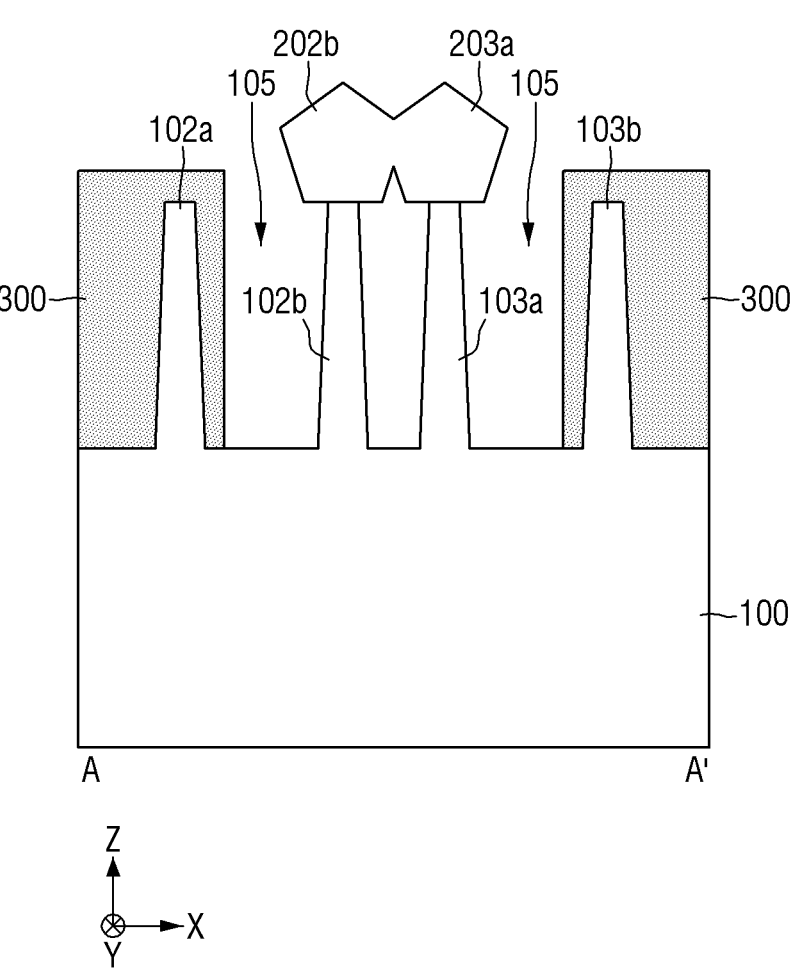

Referring to FIGS. 10 and 11, regarding the fins 102*b* and 103*a* that are not covered with the masking material, gases may be injected to perform the selective epitaxial growth (SEG).

Through such epitaxial growth, a source/drain 202*b* and 203*a* may be generated only in the test group area T_R described above with reference to FIGS. 3 to 5.

In exemplary embodiments, the source/drain 202*b* and 203*a* in the test group area T_R may have a cross-section having a shape similar to a pentagon.

Figure 12:
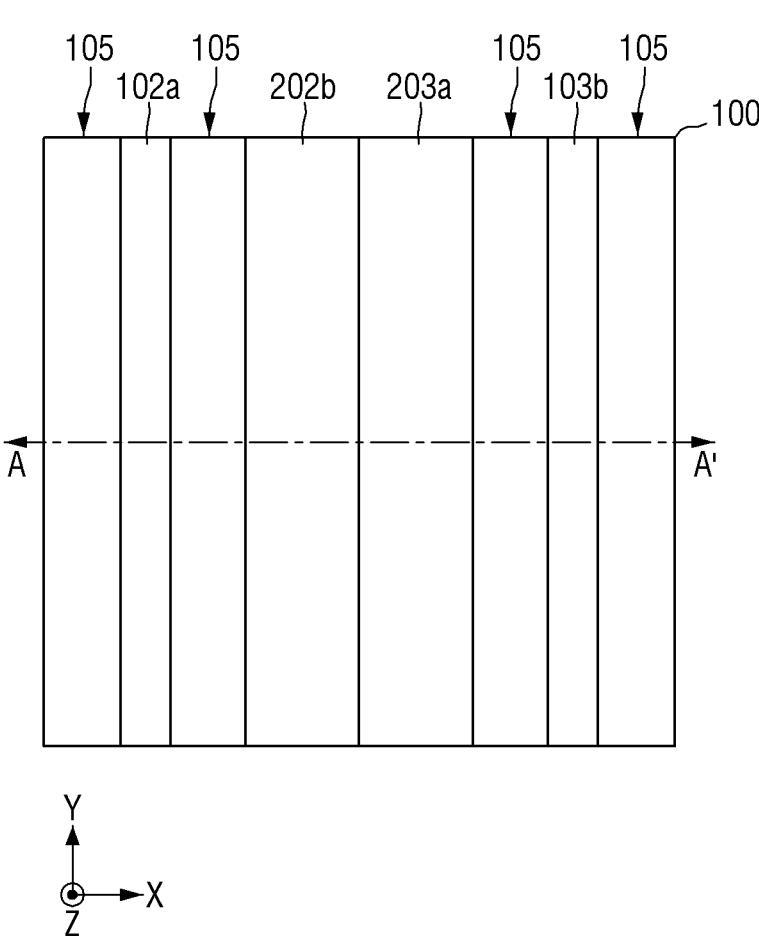
Figure 13:
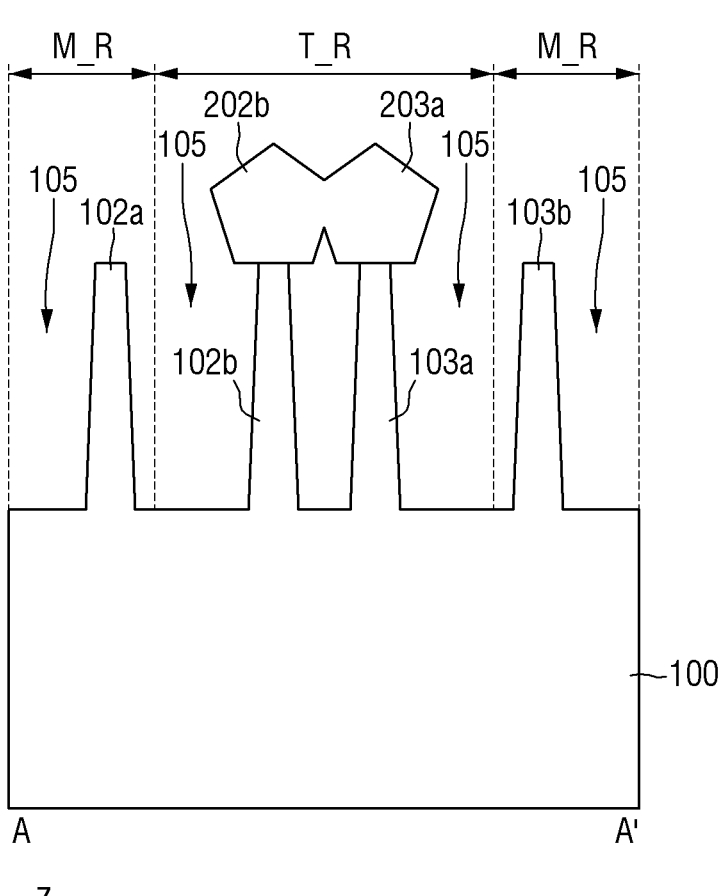
Figure 13:
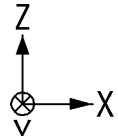

Thereafter, referring to FIGS. 12 and 13, the masking material 300 covering the active fins 102*a* and 103*b* may be removed.

By the epitaxial growth, formation efficiency of the source/drain 202*b* and 203*a* may be amplified only in a certain area (e.g., the test group area T_R) within the test areas TA. As a result, the test reliability of electrical characteristics of the source/drain 202*b* and 203*a* may be improved.

Figure 14:
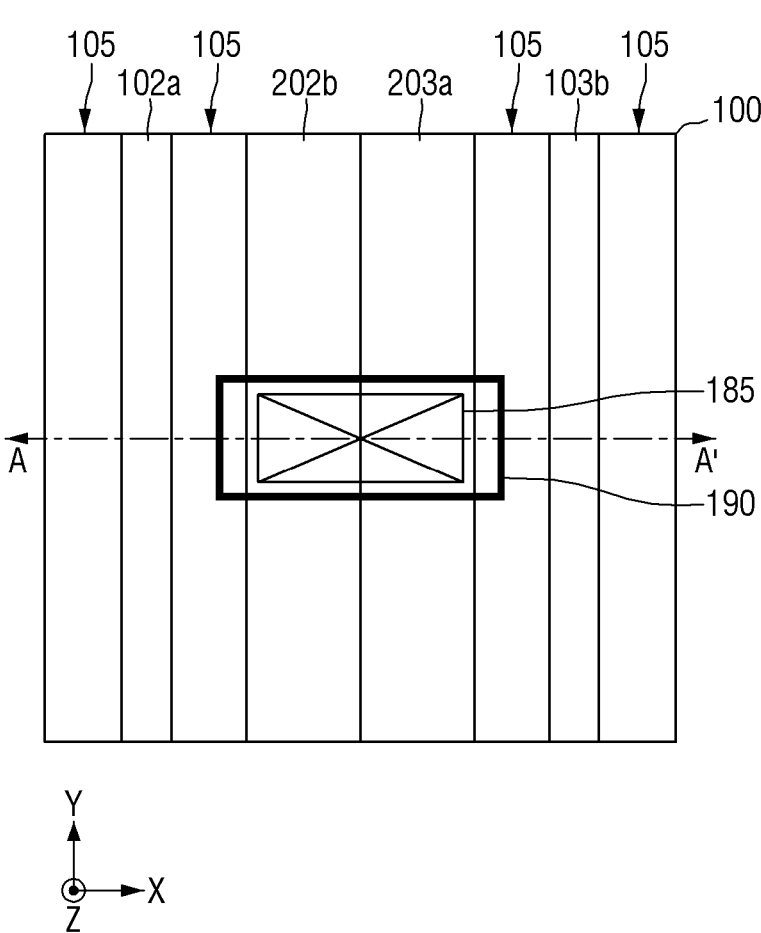
Figure 15:
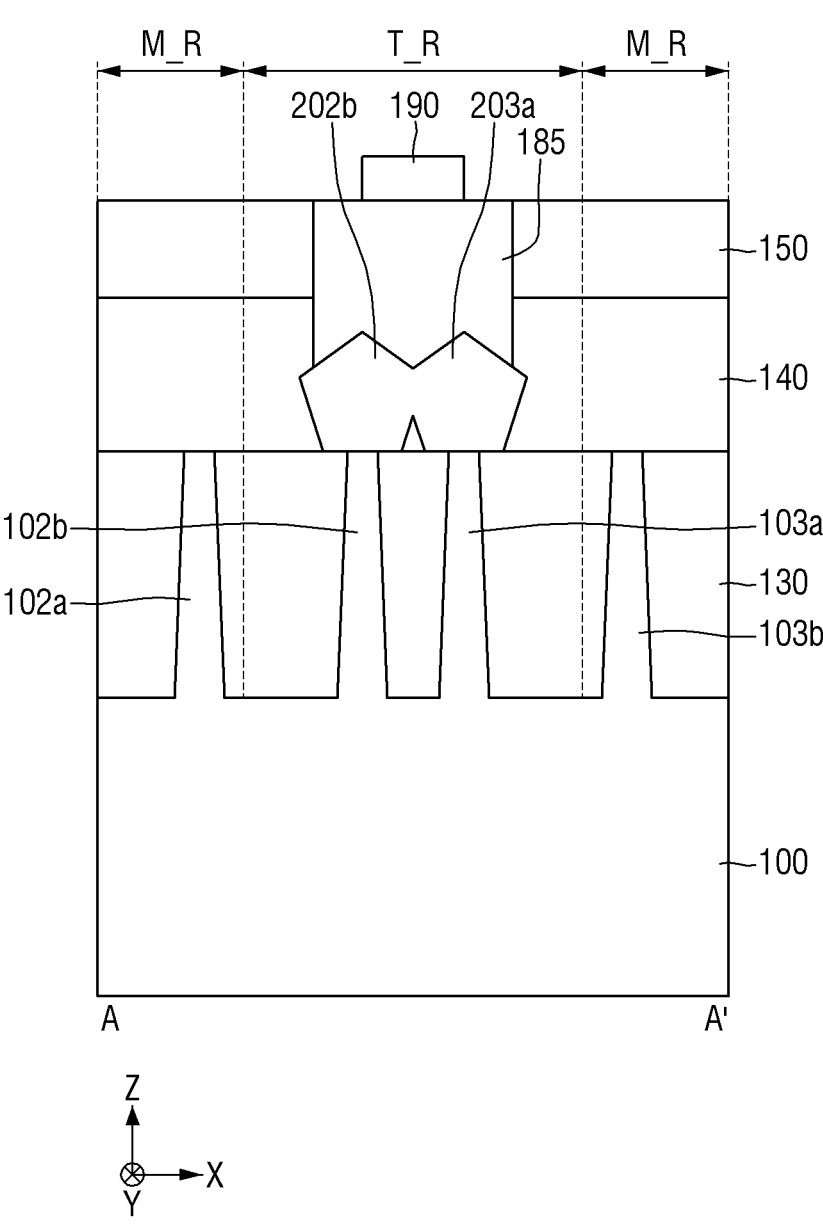

Referring to FIGS. 14 and 15, in order to test the electrical characteristics of the source/drains 202*b* and 203*a*, a contact 185 and a metal line 190 may be electrically connected on the sources/drains 202*b* and 203*a*.

In more detail, a first insulating layer 130 surrounding the plurality of active fins 102*a*, 102*b*, 103*a*, and 103*b* may be formed. Thereafter, a second insulating layer 140 surrounding at least a portion of the source/drain 202*b* and 203*a* and the contact 185 may be formed on the first insulating layer 130. Thereafter, a third insulating layer 150 surrounding the contact 185 may be formed on the second insulating layer 140. Thereafter, the metal line 190 electrically connected to the contact 185 may be formed.

The contact 185 and the metal line 190 may be formed of a conductive material.

The first insulating layer 130, the second insulating layer 140, and the third insulating layer 150 may be formed of an insulating material.

In order to test the test area TA, an electrical test may be performed on the test area TA by applying a current or voltage for the test to the metal line 190. For example, when the source/drain 202*b* and 203*a* include different transistors performing different operations, it is possible to test whether the sources/drain 202*b* and 203*a* are connected to each other and cause a failure.

Figure 16:
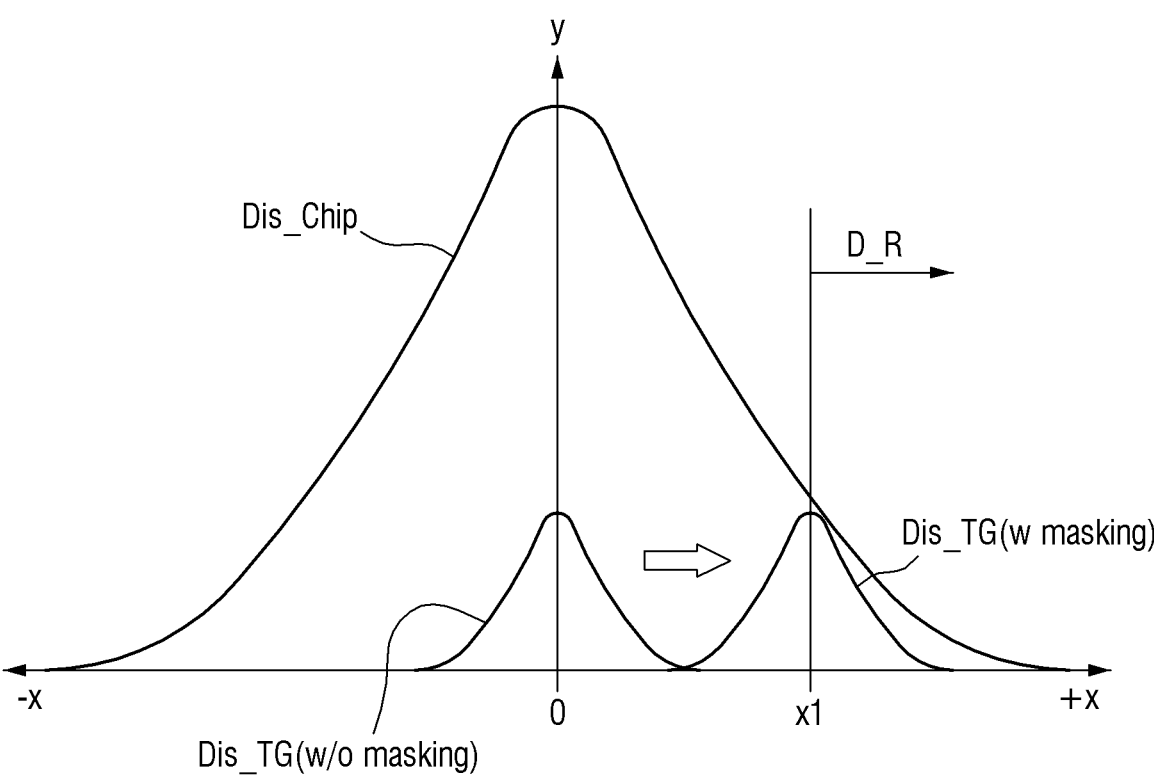
FIG. 16 is an exemplary graph for explaining a result of improved test reliability of an integrated circuit through the fabricating method for the test element group according to some exemplary embodiments.

FIG. 16 is an exemplary graph for explaining a result of improved test reliability of an integrated circuit through the fabricating method for the test element group according to some exemplary embodiments.

Referring to FIG. 16, a distribution graph distributed in a −x direction and a +x direction based on 0 may be confirmed. In the distribution graph of FIG. 16, test integrated circuits having a value greater than or equal to an xl value in the +x direction with respect to 0 may be defined as circuits included in a defective area D_R.

Referring to FIGS. 1, 2, and 16 together, a distribution graph Dis_Chip for a source/drain pair included in a plurality of chip areas CA is illustrated. If the test is performed on the test area TA without generating the masking area as illustrated in FIGS. 3 to 5, the integrated circuit in the test area TA included in the defective area D_R may not be found as in a graph Dis_TG (w/o masking).

However, according to the fabricating method for the test element group according to some exemplary embodiments, when at least a portion of the test area TA is set as the masking area M_R and the source/drain is then intensively formed only in the test group area T_R, the distribution graph Dis_TG(w masking) moves in the +x direction, so that the integrated circuit in the test area TA included in the defective area D_R may be found. That is, reliability of the test area TA may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A fabricating method for a test element group, the fabricating method comprising:

fabricating test areas generated in a scribe lane area, wherein the fabricating of the test areas includes:

forming, on a substrate, a first region and second regions disposed on sides of the first region, forming a first fin and a second fin in the first region, and forming third fins in the second regions, covering the second regions with a masking material, injecting a gas onto the substrate with the second regions covered with the masking material to respectively form a first source/drain area and a second source/drain area on the first fin and the second fin, wherein the gas is not injected onto the third fins and a source/drain area is not formed on the third fins during the fabrications of the test element group, and wherein, in the first region, the first source/drain area is in contact with the second source/drain area.

2. The fabricating method as claimed in claim 1, wherein forming the first source/drain area and the second source/drain area comprises performing selective epitaxial growth (SEG).

3. The fabricating method as claimed in claim 1, wherein the gas includes a silicon source gas, a germanium source gas, an etching gas, and a carrier gas.

4. The fabricating method as claimed in claim 1, wherein the fabricating of the test areas further includes removing the masking material after the gas is injected.

5. The fabricating method as claimed in claim 4, wherein the fabricating of the test areas further includes, after the removing of the masking material, generating a first insulating layer surrounding each of the first fin, the second fin, and the third fins, forming a second insulating layer surrounding each of the first source/drain area and the second source/drain area on the first insulating layer, generating contacts on each of the first source/drain area and the second source/drain area, forming a third insulating layer surrounding the contact on the second insulating layer, and generating a metal lines electrically connected to the contact.

6. The fabricating method as claimed in claim 1, wherein a source/drain defect detection test is performed based on the first source/drain area and the second source/drain area.

7. The fabricating method as claimed in claim 1, wherein the covering of the masking material is performed through a photo process.

8. A fabricating method for a test element group, the fabricating method comprising:

generating a plurality of chip areas on a substrate;

generating a scribe lane area that divides the plurality of chip areas; and generating test areas in the scribe lane area, wherein the fabricating of the test areas includes:

forming, on the substrate, a first region and second regions disposed on sides of the first region, forming a first fin and a second fin on the first region, and forming third fins on the second regions, covering the second regions with a masking material, and injecting a gas onto the substrate after covering the second regions to respectively form a first source/drain area and a second source/drain area on the first fin and the second fin, wherein the gas is not injected onto the third fins so that a source/drain area is not formed on the third fins during fabrication of the test element group, and wherein, on the first region, the first source/drain area is in contact with the second source/drain area.

9. The fabricating method as claimed in claim 8 wherein forming the first source/drain area and the second source/drain area comprises performing selective epitaxial growth (SEG).

10. The fabricating method as claimed in claim 8, wherein the gas includes a silicon source gas, a germanium source gas, an etching gas, and a carrier gas.

11. The fabricating method as claimed in claim 8, wherein the fabricating of the test areas further includes removing the masking material after the gas is injected.

12. The fabricating method as claimed in claim 11, wherein the fabricating of the test areas further includes, after the removing of the masking material:

generating a first insulating layer surrounding each of the first fin, the second fin, and the third fins, forming a second insulating layer surrounding each of the first source/drain area and the second source/drain area, generating contacts on each of the first source/drain area and the second source/drain area, forming a third insulating layer surrounding the contacts on the second insulating layer, and generating a metal line electrically connected to the contacts.

13. The fabricating method as claimed in claim 8, wherein a source/drain defect detection test is performed based the first source/drain area and the second source/drain area.

14. The fabricating method as claimed in claim 8, wherein the covering of the masking material is performed through a photo process.

15. A fabricating method for a test element group, the fabricating method comprising:

generating a plurality of chip areas on a substrate;

generating a scribe lane area that divides the plurality of chip areas; and generating test areas in the scribe lane area, wherein the fabricating of the test areas includes:

dividing the test areas in which integrated circuits included in the plurality of chip areas are fabricated into a test group area and a masking area, covering the masking area with a masking material, injecting a gas onto the test areas such that a plurality of source/drain areas are generated through epitaxial growth only within the test group area, and the plurality of source/drain areas are in contact with each other.

16. The fabricating method as claimed in claim 15, wherein the number of the test group areas is plural.

17. The fabricating method as claimed in claim 15, wherein the test group area has a rectangular shape.

18. The fabricating method as claimed in claim 15, wherein the test group area has a shape including a curve.

19. The fabricating method as claimed in claim 15, wherein source/drain areas of the plurality of source/drain areas are not formed in the masking area.

20. The fabricating method as claimed in claim 19, wherein a fin protruding in a first direction on the substrate is formed in the masking area.

* * * * *